United States Patent

Rodriguez

Patent Number: 5,376,008
Date of Patent: Dec. 27, 1994

[54] RETAINER FOR ELASTOMERIC CONTACT ELEMENT

[75] Inventor: Charles J. Rodriguez, Clearwater, Fla.

[73] Assignee: The Whitaker Corporation, Wilmington, Del.

[21] Appl. No.: 141,159

[22] Filed: Oct. 21, 1993

[51] Int. Cl.$^5$ .............................. H01R 9/09
[52] U.S. Cl. ........................ 439/66; 439/74
[58] Field of Search ............... 439/66, 67, 68, 70, 439/71, 74, 80, 620

[56] References Cited

U.S. PATENT DOCUMENTS

| | | | |
|---|---|---|---|
| 3,638,163 | 1/1972 | Loosme | 439/66 X |
| 3,858,958 | 1/1975 | Davies | 439/66 |
| 3,985,413 | 10/1976 | Evans | 439/66 |
| 4,818,241 | 4/1989 | Smooth | 439/65 |
| 5,035,628 | 7/1991 | Casciotti et al. | 439/66 |
| 5,118,300 | 6/1992 | Zarreii | 439/79 |
| 5,273,450 | 12/1993 | Renn et al. | 439/66 X |

Primary Examiner—Z. R. Bilinsky
Attorney, Agent, or Firm—Anton P. Ness

[57] ABSTRACT

A retainer (48) for a resilient contact element which includes an elongated cylindrical elastomeric body member (32) and a flexible film (38) wrapped around the body member (32). The film has a plurality of straight line conductors (40) on its surface. The retainer includes a body (10) with an elongated open channel and a plurality of spaced retaining members (48) extending over the open channel. Each of the retaining members has a central cavity (50) sized to accommodate the contact element (30) without substantial compressive deformation of the contact element, and further includes a passageway (52) communicating with the cavity (50). The passageway is sized to deformably compress the contact element as the contact element passes therethrough. Accordingly, the contact element is deformably compressed as it passes through the passageway and then expands as it enters the cavity.

10 Claims, 2 Drawing Sheets

RETAINER FOR ELASTOMERIC CONTACT ELEMENT

FIELD OF THE INVENTION

This invention relates to connector assemblies utilizing intermediate elastomeric contact elements and, more particularly, to a retainer for such an elastomeric contact element.

BACKGROUND OF THE INVENTION

U.S. Pat. No. 5,118,300, issued Jun. 2, 1992, discloses in FIGS. 14–16 a connector assembly for interconnecting a daughter board and a mother board. This connector assembly includes an intermediate elastomeric contact element of the type disclosed in U.S. Pat. No. 3,985,413, issued Oct. 12, 1976, and sold under the trademark AMPLIFLEX by AMP Incorporated of Harrisburg, Pa., for incorporating a circuit with active elements in the paths between the daughter board and the mother board. The contents of U.S. Pat. No. 5,118,300 and the contents of U.S. Pat. No. 3,985,413 are hereby incorporated by reference herein.

It is an object of the present invention to provide an improved retainer for holding the elastomeric contact element of the '413 patent within the connector assembly of the '300 patent.

SUMMARY OF THE INVENTION

The foregoing, and additional, objects are attained in accordance with the principles of this invention by providing a retainer for a resilient contact element, the contact element including an elongated cylindrical elastomeric body member and a flexible film wrapped around the body member. The film has a plurality of parallel straight line conductors on its surface facing away from the body member so that the conductors extend around the body member. The retainer includes a body with an elongated open channel for supporting the contact element therein, with the channel having its cross section dimensioned at least as large as the cross section of the contact element so that the contact element can be supported in the channel without being compressibly deformed. The retainer further includes a plurality of spaced retaining members secured to the body and extending partially over the open channel. Each of the retaining members has a central cavity communicating with the open channel in a direction substantially aligned with the direction of elongation of the channel. The cavity is sized to accommodate the contact element without substantial compressive deformation of the contact element, and each of the retaining members further includes a passageway communicating with the cavity in a direction transverse to the direction of elongation of the channel, with the passageway being sized to deformably compress the contact element as the contact element passes therethrough. Accordingly, the contact element is deformably compressed locally as it is urged transversely to pass through the passageway, and then expands as enters the cavity.

In accordance with an aspect of this invention, the cavity is substantially circular when viewed along the open channel.

In accordance with another aspect of this invention, the passageway tapers inwardly toward the cavity, thereby facilitating insertion.

In accordance with a further aspect of this invention, the passageway intersects the cavity along an arc of approximately ninety degrees.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
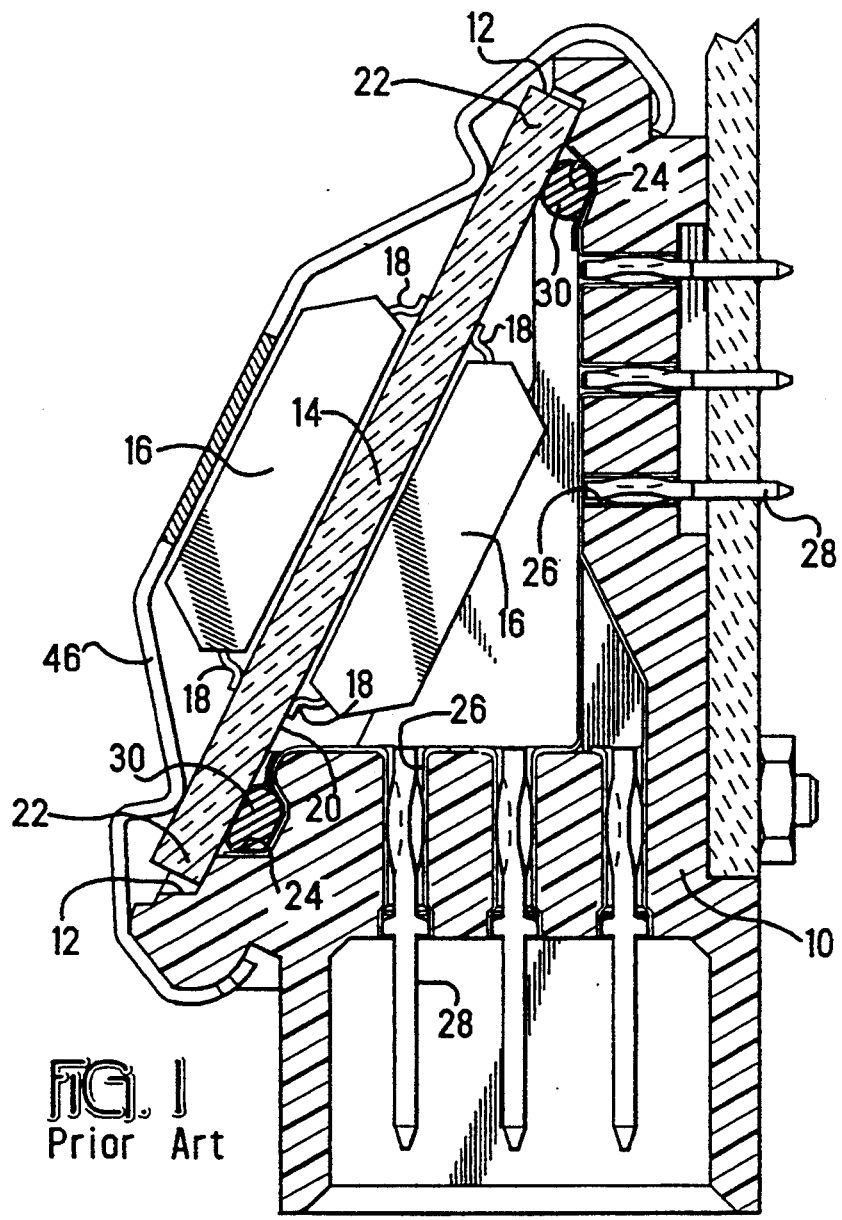
FIG. 1 is an elevational and sectional view of the prior art connector assembly of the referenced U.S. Pat. No. 5,118,300.

As shown in FIG. 1, the connector assembly disclosed in U.S. Pat. No. 5,118,300 includes a housing 10 of dielectric material suitable for the coating or plating of conductive material thereon. The housing 10 includes, on interior surfaces thereof, a pair of spaced apart surfaces 12 adapted to receive a dielectric substrate 14 including one or more active components 16. The components 16 have leads 18 soldered surface-mount style to conductors on the surface 20 of the substrate 14 and which extend to the opposed ends 22 of the substrate 14.

Adjacent to the surfaces 12 are elongated open channels 24 which have surface conductors therein which in turn join conductive material extending into the cavities 26 within the housing 10, to be engaged by the contacts 28. Held within the channels 24 are resilient contact elements 30 of the type shown in FIG. 2 and disclosed in U.S. Pat. No. 3,985,413.

Figure 2:
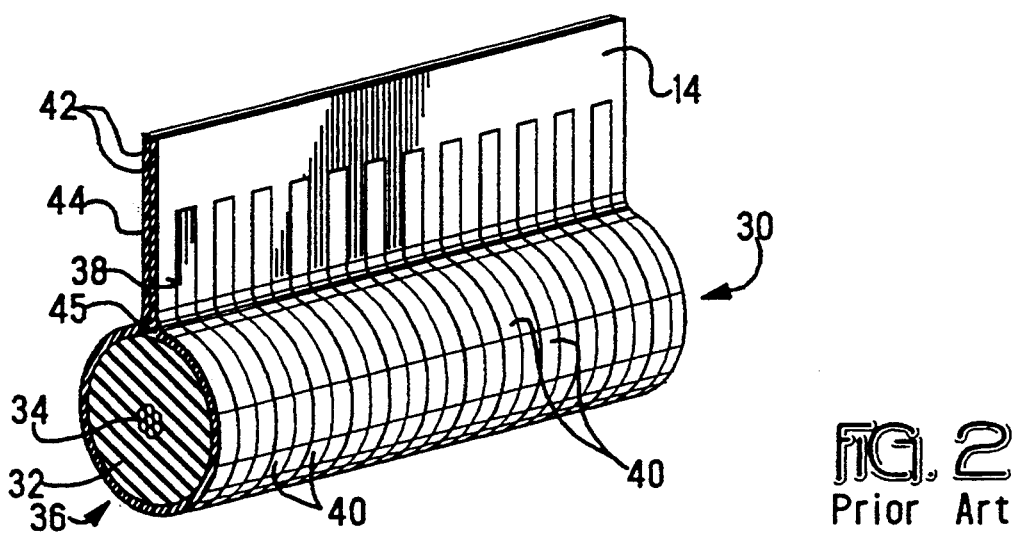
FIG. 2 is a perspective view of the elastomeric contact element disclosed in the referenced U.S. Pat. No. 3,985,413.

As shown in FIG. 2, each of the contact elements 30 is shown to comprise a cylindrical elastomeric body 32 which may have a center core 34 of fiber glass or metal strands. A flexible circuit generally indicated at 36 is wrapped around the body 32. The flexible circuit 36 comprises a thin film 38 of polymeric material which should be flexible so that it can be wrapped around the body 32 but which will not elongate significantly when stressed in a tensile mode. The film 38 has a plurality of parallel relatively narrow straight conductors 40 on its external surface which faces away from the body 32. The width of the film 38 as viewed in FIG. 2 is significantly greater than the circumference of the body 32. The marginal side portions 42 are against each other and extend radially with respect to the body 32 to form a tab 44. The opposed surfaces of these marginal side portions 42 are bonded to each other by suitable bonding material 45. The conductors 40 are of uniform length and have their ends in alignment spaced from the side edges of the film (i.e., the free end of the tab 44) so that there is a portion of film adjacent to the free end of the tab 44 which is devoid of conductors. Preferably, the conductors 40 are about 0.003 inches wide and spaced apart about 0.007 inches. Thus, for each of the conductors on the surface 20 of the substrate 14 and within the channels 24 of the housing 10, there is a multiplicity of individual conductors 40 of the contact element 30. This multiplicity is on the order of two or three.

Each of the contact elements 30 in FIG. 1 is held within a respective one of the channels 24 and are resilient to provide a force driving the conductors outwardly in a manner to interconnect the conductors on the substrate 14 with respective ones of the conductors on the surfaces of the channels 24.

The substrate 14 is secured to the housing 10 by a spring clip or bracket 46. With the bracket 46 latched in place, as shown in FIG. 1, the substrate 14 ms urged firmly against the connectors 30 to thereby deformably compress the connectors 30 against the surfaces of the channels 24 and establish assured electrical connections between the conductors on the substrate 14 and respective ones of the conductors in the channels 24.

Figure 3:
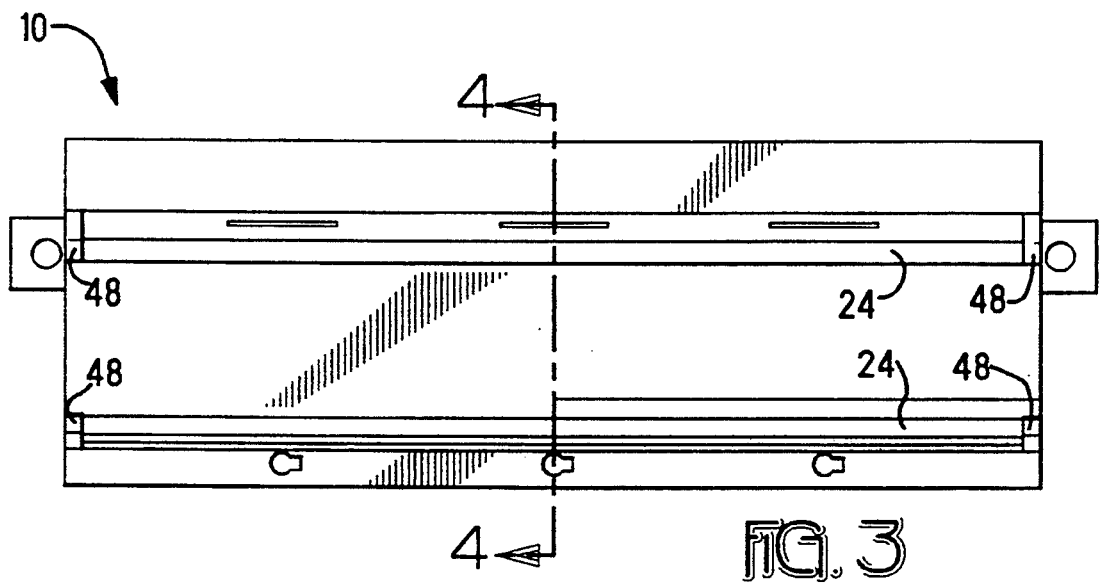
FIG. 3 is a plan view of a housing for a connector assembly of the type shown in FIG. 1 incorporating retainer structure constructed in accordance with the principles of this invention.

FIG. 3 is a plan view of the housing 10 incorporating retainer structure constructed in accordance with the principles of this invention. To avoid unduly complicating the drawing, the conductors on the surface of the housing 10 are not shown in FIG. 3. In accordance with the principles of this invention, at the ends of each of the channels 24 are retaining members 48. The spacing between each pair of the retaining members 48 at opposite ends of the respective channel 24 is at least as great as the dimension of the substrate 14 which spans the conductors thereon so that each pair of the retaining members 48 flanks the substrate 14 when it is positioned as shown in FIG. 1.

Figure 4:
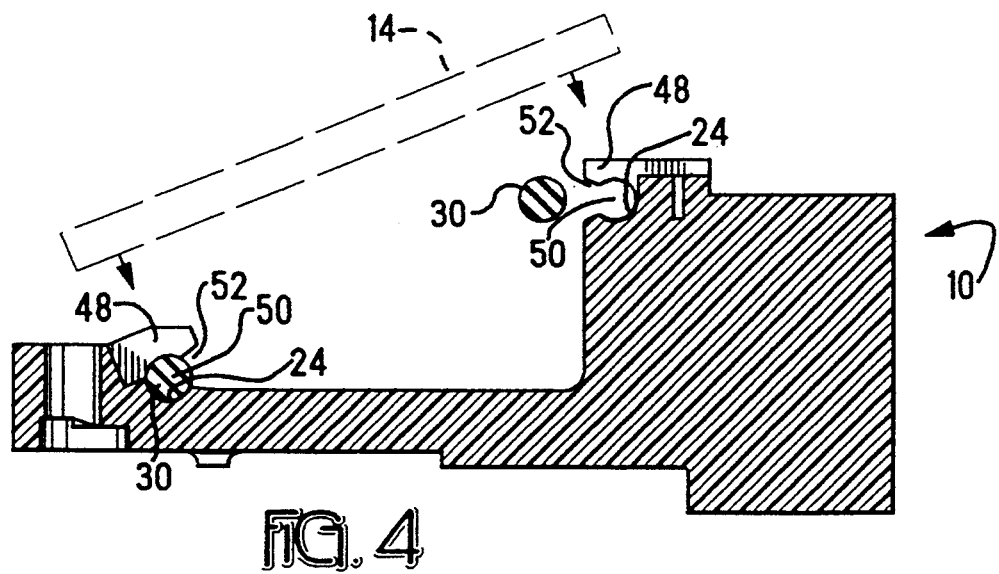
FIG. 4 is a cross sectional view taken along the lines 4—4 in FIG. 3 and also showing elastomeric contact elements in place or being inserted into position, and a representative circuit positioned to be secured to the connector assembly and engage and compress the elastomeric contact elements.

As best shown in FIG. 4, each of the channels 24 is preferably formed as an arc of a circle having a diameter at least as great as the diameter of the contact element 30 so that the contact element 30 can be supported in its respective channel 24 without being compressively deformed. The retaining members 48 are secured to the housing 10 and extend over their respective channels 24. Preferably, the retaining members 48 are formed integrally with the housing 10. Each of the retaining members 48 has a central cavity 50 which communicates with its respective channel 24 in a direction which is substantially aligned with the direction of elongation of the channel. The cavity 50 is substantially circular when viewed along the channel 24, and the circle of the cavity 50 is a continuation of the circular arc of the channel 24. Accordingly, a contact element 30 can be accommodated within a cavity 50 without substantial compressive deformation of the contact element. Further, each of the retaining members 48 includes a passageway 52 which communicates with the cavity 50 in a direction transverse to the direction of elongation of the respective channel 24. Preferably, the passageway 52 tapers inwardly toward the cavity 50 and intersects the cavity 50 along an arc of approximately ninety degrees. Therefore, when a contact element 30 is installed, it is urged transversely to pass through the passageway 52 which causes the contact element 30 to be deformably compressed locally, the contact element 30 then expanding as it enters the cavity 50. An elastomeric contact element 30 is shown in position in one channel 24, and another contact element 30 is poised to be inserted into its respective channel 24 by being urged transversely through the passageway 52 of the retaining member 48 and to be elastically deformed until passing into the cavity 50 and resuming a substantially uncompressed state when seated within the channel 24. The circuit 14 is shown in phantom positioned to thereafter be placed onto the connector assembly 10 against the elastomeric contact elements 30 and establish electrical connections therewith and to conductors (not shown) of the connector assembly 10.

As described, the inventive retaining structure is easily molded as part of the housing 10 and holds the contact elements 30 without any undesirable deformation thereof.

Accordingly, there has been disclosed an improved retainer for an elastomeric contact element. While an illustrative embodiment of the present invention has been disclosed herein, it is understood that various modifications and adaptations to the disclosed embodiment will be apparent to those of ordinary skill in the art and it is intended that this invention only be limited by the scope of the appended claims.

I claim:

1. A retainer for a resilient contact element which includes an elongated cylindrical elastomeric body member (32) and a flexible film (38) wrapped around said body member, said film having a plurality of parallel straight line conductors (40) on the surface of said film facing away from said body member so that said conductors extend around said body member, the retainer comprising:

a body (10) having an elongated open channel (24) for supporting said contact element therein, said channel having its cross section dimensioned at least as large as the cross section of said contact element so that said contact element can be supported in said channel without compressive deformation of said contact element; and a plurality of spaced retaining members (48) secured to said body and extending partially over said open channel, each of said retaining members having a central cavity (50) communicating with said open channel in a direction substantially aligned with the direction of elongation of said channel, said cavity being sized to accommodate said contact element without substantial compressive deformation of said contact element, each of said retaining members further including a passageway (52) communicating with said cavity in a direction transverse to the direction of elongation of said channel, said passageway being sized to deformably compress said contact element as said contact element passes therethrough;

whereby said contact element is deformably compressed locally as it is urged transversely to pass through said passageway and expands as it enters said cavity.

2. The retainer according to claim 1 wherein the cross section of said open channel is shaped from an arc of a circle and said cavity is substantially circular when viewed along said open channel, the circle of said cavity being a continuation of the circular arc of said open channel.

3. The retainer according to claim 1 wherein said passageway tapers inwardly toward said cavity.

4. The retainer according to claim 1 wherein the cross section of said open channel is shaped from an arc of a circle and said cavity is substantially circular when viewed along said open channel, the circle of said cavity being a continuation of the circular arc of said open channel, said passageway tapers inwardly toward said cavity, and said passageway intersects said cavity along an arc of approximately ninety degrees.

5. The retainer according to claim 4 wherein said plurality of retaining members are formed integrally with said body.

6. A connector assembly for electrically interconnecting a first plurality of conductors on the surface of a dielectric substrate (14) with respective ones of an equal plurality of conductors on the surface of a dielectric housing (10), comprising:
- a resilient contact element (30) including an elongated cylindrical elastomeric body member (32) and a flexible film (38) wrapped around said body member, said film having a second plurality of parallel straight line conductors (40) on the surface of said film facing away from said body member so that said conductors extend around said body member, there being at least as many of said second plurality of conductors as there are of said first plurality of conductors;
- said dielectric housing having an elongated open channel (24) on said surface and supporting said contact element therein, said plurality of conductors on said housing surface being within said channel, said channel having its cross section dimensioned at least as large as the cross section of said contact element so that said contact element is supported in said channel without compressive deformation of said contact element;
- a spaced pair of retaining members (48) secured to said housing and extending over said open channel, each of said retaining members having a central cavity (50) communicating with said open channel in a direction substantially aligned with the direction of elongation of said channel, said cavity being sized to accommodate said contact element without substantial compressive deformation of said contact element, each of said retaining members further including a passageway (52) communicating with said cavity in a direction transverse to the direction of elongation of said channel, said passageway being sized to deformably compress said contact element as said contact element passes therethrough, the spacing between said pair of retaining members being at least as great as the dimension of said substrate across said first plurality of conductors; and
- means (46) for securing said substrate in overlying relation to said housing with said pair of retaining members flanking said substrate, with said pluralities of conductors on said substrate and said housing being in overlying alignment, and with said contact element being deformably compressed within said channel between same substrate and said housing.

7. The connector assembly according to claim 6 wherein the cross section of said open channel is shaped from an arc of a circle and said cavity is substantially circular when viewed along said open channel, the circle of said cavity being a continuation of the circular arc of said open channel.

8. The connector assembly according to claim 6 wherein said passageway tapers inwardly toward said cavity.

9. The connector assembly according to claim 6 wherein the cross section of said open channel is shaped from an arc of a circle and said cavity is substantially circular when viewed along said open channel, the circle of said cavity being a continuation of the circular arc of said open channel, said passageway tapers inwardly toward said cavity, and said passageway intersects said cavity along an arc of approximately ninety degrees.

10. The connector assembly according to claim 9 wherein said pair of retaining members are formed integrally with said housing.

* * * * *